US008949651B2

(12) United States Patent
Turullols

(10) Patent No.: US 8,949,651 B2
(45) Date of Patent: Feb. 3, 2015

(54) MULTIPLE CLOCK DOMAIN CYCLE SKIPPING UTILIZING OPTIMAL MASK TO MINIMIZE VOLTAGE NOISE

(71) Applicant: Oracle International Corporation, Redwood City, CA (US)

(72) Inventor: Sebastian Turullols, Los Altos, CA (US)

(73) Assignee: Oracle International Corporation, Redwood City, CA (US)

(*) Notice: Subject to any disclaimer, the term of this patent is extended or adjusted under 35 U.S.C. 154(b) by 271 days.

(21) Appl. No.: 13/631,296

(22) Filed: Sep. 28, 2012

(65) Prior Publication Data
US 2014/0095909 A1 Apr. 3, 2014

(51) Int. Cl.
*G06F 1/08* (2006.01)
*H03K 17/16* (2006.01)

(52) U.S. Cl.
CPC . *G06F 1/08* (2013.01); *H03K 17/16* (2013.01)
USPC .......................................... 713/501; 713/322

(58) Field of Classification Search
CPC ............ G06F 1/08; G06F 1/324; H03K 17/16
USPC ................................................... 713/322, 501
See application file for complete search history.

(56) References Cited

U.S. PATENT DOCUMENTS

2009/0327791 A1* 12/2009 Aerts ............................ 713/500
2010/0131784 A1* 5/2010 Petrick ......................... 713/320

* cited by examiner

*Primary Examiner* — Albert Wang
(74) *Attorney, Agent, or Firm* — Polsinelli PC

(57) ABSTRACT

Implementations of the present disclosure involve an apparatus and/or method for providing one or more clock signals that include a skipped clock cycle to a portion of a computing system. The skipped cycle clock signals may be changed by the computing system during operation of the system by altering masks applied to a global clock signal. However, the flexibility to alter various skipped cycle clock signals may introduce noise or signal disruptions within the system. Thus, the present disclosure may also involve an apparatus and/or method for managing the altering of the clock cycle skipping masks to manage the voltage noise introduced into the system by the adjustment of the operating frequency of the portions of the system. In one embodiment, the method includes prioritizing or otherwise ordering the bits of the masks applied to the global clock signal to attempt to prevent similar bits from being altered simultaneously.

20 Claims, 7 Drawing Sheets

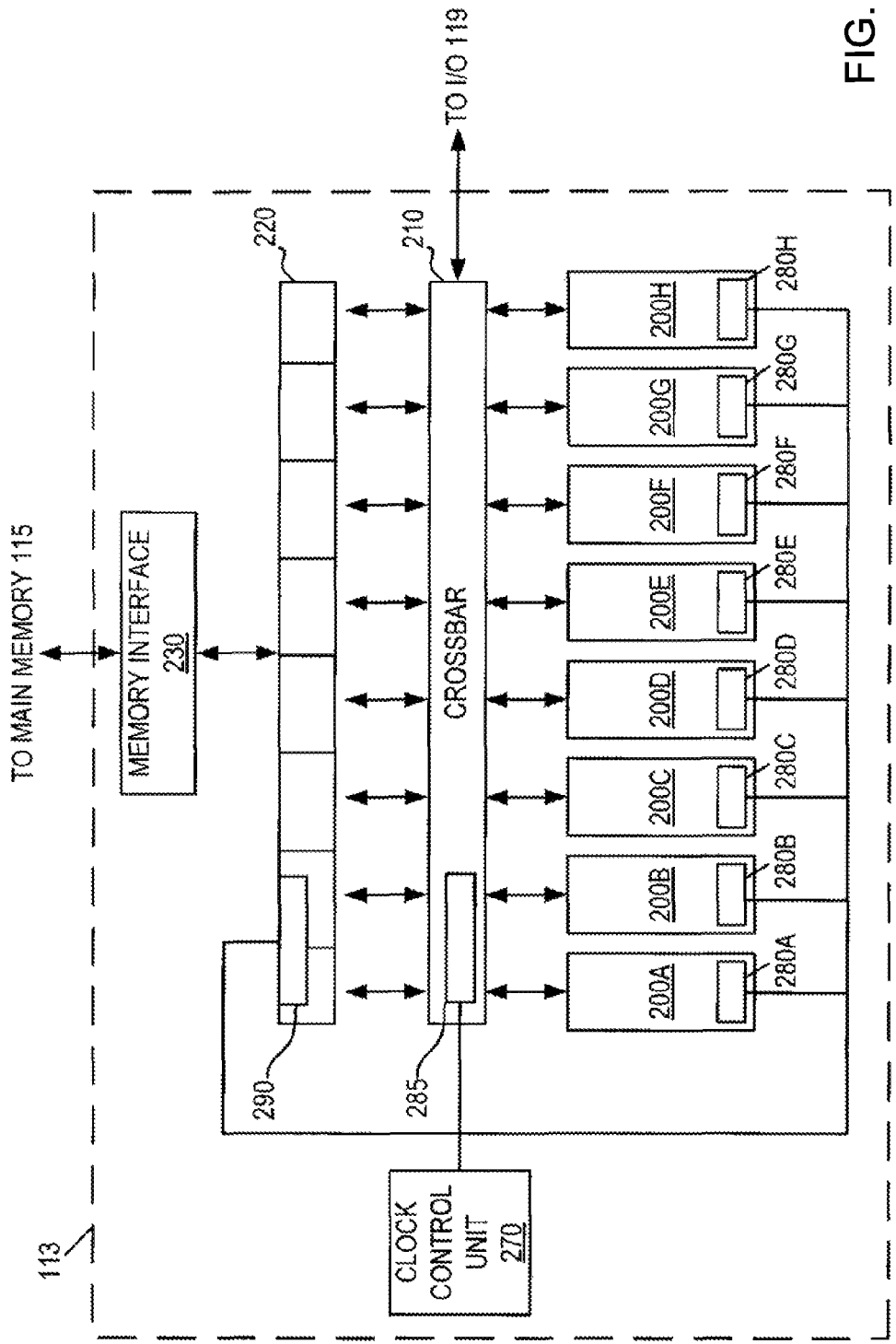

MULTIPLE CLOCK DOMAIN CYCLE SKIPPING UTILIZING OPTIMAL MASK TO MINIMIZE VOLTAGE NOISE

FIELD OF THE DISCLOSURE

Aspects of the present invention relate to computing systems and, more particularly, aspects of the present invention involve an apparatus and/or method for skipping clock cycles across multiple domains of a microprocessor that minimizes the on-die voltage noise created by the clock cycle skipping.

BACKGROUND

Electronic devices are ubiquitous in society and can be found in everything from wristwatches to computers. The complexity and sophistication of these electronic devices usually increases with each generation. For example, newer microprocessors often have higher operating frequencies than previous generations of microprocessors. As a result of the increased operating frequencies, newer generations of microprocessors may consume more power than previous generations of microprocessors.

In addition to the increased operating frequency potentially causing increased power consumption, this increased operating frequency also may cause a growing disparity between the speed that a computer's microprocessor operates at versus the computer's memory access speed. Because of this disparity, computers with high speed microprocessors may spend a large amount of time waiting for memory references to complete instead of performing computational operations. Some microprocessors may attempt to execute multiple threads of program code concurrently to offset this downtime. Notwithstanding the increase in throughput of the program code that comes with multi-threading, there still remains a need for providing methods and apparatuses that conserve power in multi-threaded processors.

It is with these and other issues in mind that various aspects of the present disclosure were developed.

SUMMARY

One implementation of the present disclosure may take the form of a method of power savings on a processor. The method may include the operation of providing a first skipped cycle timing signal to a processor, wherein the first skipped cycle timing signal includes a gated representation of a global timing signal and a first symbol, wherein the first symbol comprises a plurality of non-asserted bits in a plurality of bit positions and an asserted bit in at least one other bit position, wherein the plurality of non-asserted bits correspond to a skipped cycle of the global timing signal. Additionally, the method may include the operations of receiving a request to adjust the first skipped cycle timing signal in response to a plurality of factors related to processor conditions, selecting a bit position from the plurality of bit positions of non-asserted bits, generating a second symbol in response to the request and providing a second skipped cycle timing signal to the processor. In general, the second skipped cycle timing signal includes a gated representation of the global timing signal and the second symbol such that the non-asserted bits of the second symbol correspond to a plurality of skipped cycles of the global timing signal and the selection of the bit position from the plurality of bit positions of non-asserted bits based at least on the voltage noise generated from providing the second skipped cycle timing signal to the processor.

Another implementation of the present disclosure may take the form of multi-threaded processor or a computer system with an input and a processor. The processor comprises a plurality of cores, wherein each core within the plurality comprises one or more header circuits and a clock control unit (CCU) coupled to the one or more header circuits. Each of the one or more header circuits provides a first domain skipped timing signal comprising a gated representation of a global clock signal and a first skipped timing symbol, each first skipped timing symbol comprising a plurality of non-asserted bits in a plurality of bit positions corresponding to a skipped cycle of the global timing signal and an asserted bit in at least one other bit position. The processor is also configured to receive a request to adjust the domain skipped cycle timing signal for at least one of the plurality of cores and assert a non-asserted bit of the first skipped timing symbol of the at least one of the plurality of cores to generate a second skipped timing symbol, the assertion based at least on the voltage noise generated from providing a second skipped cycle timing signal comprising a gated representation of a global clock signal and the second skipped timing symbol.

BRIEF DESCRIPTION OF THE DRAWINGS

FIG. 2 is a circuit diagram illustrating an example of a processing device which may be used in implementing embodiments of the present disclosure.

DETAILED DESCRIPTION

Implementations of the present disclosure involve an apparatus and/or method for providing one or more clock signals that include a skipped clock cycle to a portion of a computing system. In one particular embodiment, the computing system is a microprocessor device. A domain of the microprocessor may be a skipped clock domain to provide power savings to the processor by reducing the effective operating frequency of the domain. In one embodiment, the skipped cycle clock signal may be generated by applying a mask to a global clock signal to create one or more skipped cycles. In addition, different portions of the computing system, such as the cores of a processor, may operate on different skipped cycle clock signals to provide flexibility in processing power and power management of the system. Further still, the skipped cycle clock signals may be changed by the computing system during operation of the system by altering the masked applied to the global clock signal. In this manner, the computing system may balance the processing power and power management of the system as needed during the operation of the system.

The flexibility to provide and alter various skipped cycle clock signals to different portions of the computing system as needed may improve the power consumption of the computing system, but such flexibility may also introduce noise or signal disruptions within the system. For example, an increase in the operating frequency of a portion of the system to provide more processing power for that portion may also introduce voltage noise within the system. Such noise may potentially affect the proper operation of the system. Thus, implementations of the present disclosure also involve an apparatus and/or method for managing the altering of the clock cycle skipping masks for the different portions of the system to manage or minimize the voltage noise introduced into the system by the adjustment of the operating frequency of the portions of the system. In one embodiment, the method includes prioritizing or otherwise ordering the bits of the masks applied to the global clock signal to attempt to prevent similar bits from being altered or skipped simultaneously. Thus, the system attempts to spread out or isolate changes to the clock cycle skipping masks utilized in the system to reduce the voltage noise introduced into the system through the multiple skipped cycle clock signals.

Figure 1:
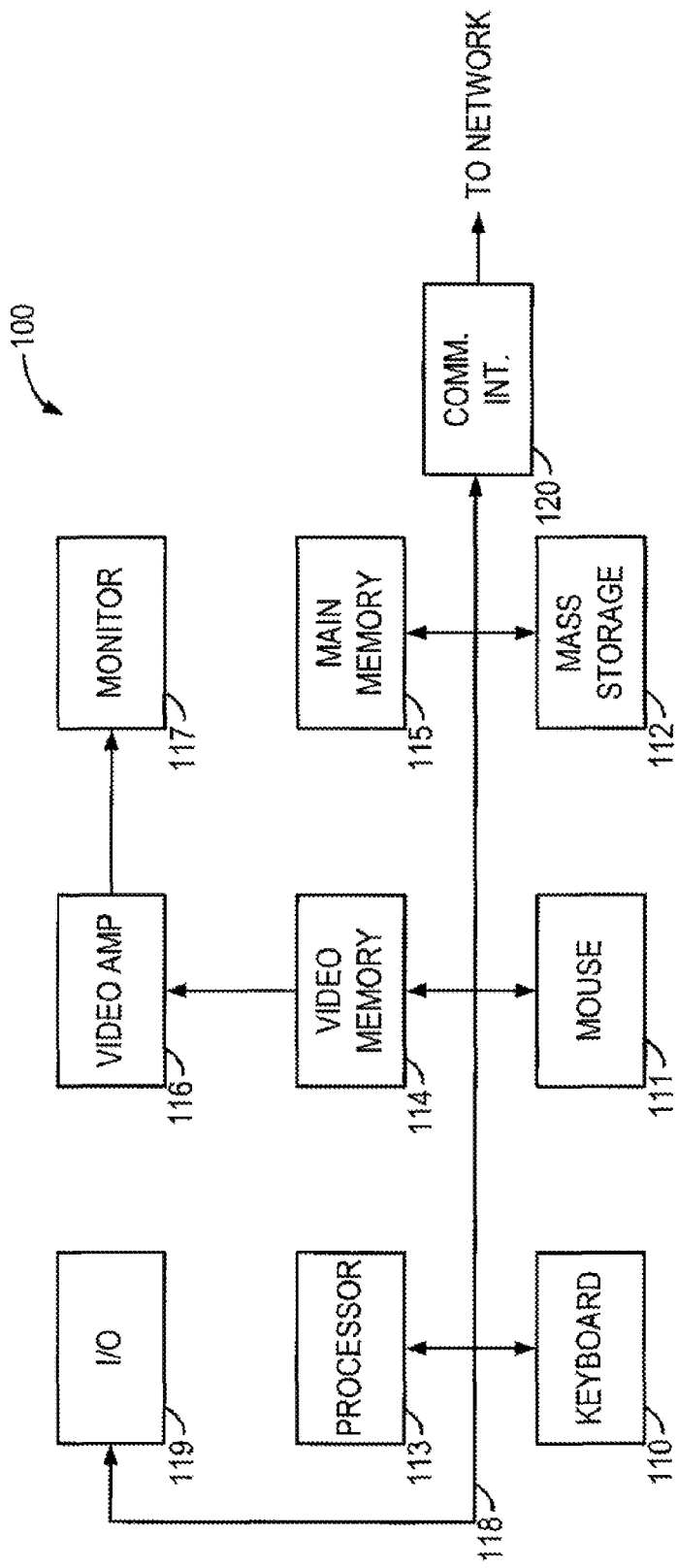
FIG. 1 is a block diagram illustrating an example of a computing system which may be used in implementing embodiments of the present disclosure.

FIG. 1 illustrates an exemplary computer system 100 capable of implementing the methods and operations described in this disclose. In some embodiments, the computer system 100 may be an implementation of enterprise level computers, such as one or more blade-type servers within an enterprise. In other embodiments, the computer system 100 may be a personal computer and/or a handheld electronic device. A keyboard 110 and mouse 111 may be coupled to the computer system 100 via a system bus 118. The keyboard 110 and the mouse 111, in one example, may introduce user input to the computer system 100 and communicate that user input to a processor 113. Other suitable input devices may be used in addition to, or in place of, the mouse 111 and the keyboard 110. An input/output unit 119 (I/O) coupled to system bus 118 represents such I/O elements as a printer, audio/video (A/V) I/O, etc.

Computer 100 also may include a video memory 114, a main memory 115 and a mass storage 112, all coupled to the system bus 118 along with the keyboard 110, the mouse 111 and the processor 113. The mass storage 112 may include both fixed and removable media, such as magnetic, optical or magnetic optical storage systems and any other available mass storage technology. The bus 118 may contain, for example, address lines for addressing the video memory 114 or the main memory 115. In some embodiments, the main memory 115 is a fully buffered dual inline memory module (FB-DIMM) that communicates serially with other system components.

The system bus 118 also may include a data bus for transferring data between and among the components, such as the processor 113, the main memory 115, the video memory 114 and the mass storage 112. The video memory 114 may be a dual-ported video random access memory. One port of the video memory 114, in one example, is coupled to a video amplifier 116, which is used to drive a monitor 117. The monitor 117 may be any type of monitor suitable for displaying graphic images, such as a cathode ray tube monitor (CRT), flat panel, or liquid crystal display (LCD) monitor or any other suitable data presentation device.

In some embodiments, the processor 113 is a SPARC® microprocessor from Sun Microsystems, Inc, although any other suitable microprocessor or microcomputer may be utilized. The processor 113 and its protocols in relation to power savings mechanisms employed by the processor are described in more detail below with regard to FIGS. 2-5.

The computer system 100 also may include a communication interface 120 coupled to the bus 118. The communication interface 120 provides a two-way data communication coupling via a network link. For example, the communication interface 120 may be a local area network (LAN) card, or a cable modem, and/or wireless interface. In any such implementation, the communication interface 120 sends and receives electrical, electromagnetic or optical signals which carry digital data streams representing various types of information.

Code received by the computer system 100 may be executed by the processor 113 as it is received, and/or stored in the mass storage 112, or other non-volatile storage for later execution. In this manner, the computer system 100 may obtain program code in a variety of forms. Program code may be embodied in any form of computer program product such as a medium configured to store or transport computer readable code or data, or in which computer readable code or data may be embedded. Examples of computer program products include CD-ROM discs, ROM cards, floppy disks, magnetic tapes, computer hard drives, servers on a network, and solid state memory devices.

FIG. 2 illustrates an exemplary implementation of the processor 113 of the system of FIG. 1 that may be capable of implementing one or more of the methods described herein for processors operating in a low power mode. In general, the power saving scheme and operations described herein may be utilized by any type of computing system that utilizes one or more skipped cycle clock signals. However, for simplicity, the embodiments of the present disclosure are discussed herein with reference to a microprocessor that includes domains operating on separate clock signals.

As shown, the processor 113 may include a plurality of processor cores 200A-H. Each of the cores 200A-H may couple to a high-level memory device, such as an outer level cache 220, via an interconnect network 210. For example, in one embodiment the outer level cache 220 is an L3 cache and the interconnect network 210 is a crossbar. In other embodiments, the outer level cache 220 may be any type of a shared memory device. Similarly, the interconnect network 210 may be any type of interconnect network, such as a ring or mesh interconnect network. For simplicity purposes only and not as a restriction to structure of the disclosed embodiments, the outer level cache 220 is referred to herein as "memory cache" and the interconnect network 210 is referred to herein as a "crossbar". However, one of ordinary skill in the art will recognize the additional structures and devices that may be included in different embodiments supporting the present disclosure. In addition, while the present disclosure discusses a multi-core processor, the embodiments described may also be utilized by a single core processor.

The memory cache 220 may couple to one or more memory interface(s) 230, which, in turn, may couple to one or more banks of main memory 115 (not specifically shown in FIG. 2). In some embodiments, the processor 113 may be implemented on a single integrated circuit. Furthermore, in some embodiments, the crossbar 210 and the memory cache 220 may be omitted, such as may be the case with a single core processor.

The cores 200A-H may be configured to execute instructions and to process data according to a particular instruction set architecture (ISA). As shown in FIG. 2, each of the cores 200A-H may be configured to operate independently of the others, such that all the cores 200A-H may execute code in parallel. Additionally, in some embodiments each of the cores 200A-H may be configured to execute multiple threads concurrently, where a given thread may include a set of instructions that may execute independent of instructions from another thread. For example, an individual software process executing on the computer system 100, such as an application, may consist of one or more threads that may be scheduled for execution by an operating system. In some implementations, each of the cores 200A-H may be configured to concurrently execute instructions from eight threads, for a total of 64 threads concurrently executing across the processor 113.

The crossbar 210 may be configured to manage data flow between the cores 200A-H and the shared cache 220. In some embodiments, the crossbar 210 may include logic (such as multiplexers or a switch fabric, for example) that may allow any core 200A-H to access any bank of memory cache 220, and that conversely may allow data to be returned from any memory bank to any core 200A-H. The crossbar 210 may be configured to concurrently process data requests from the cores 200A-H to the memory cache 220 as well as data responses from the memory cache 220 to the cores 200A-H. Further, as explained in more detail below, the crossbar 210 may coordinate communication between the cores 200A-H when the cores are operating under different clock signals.

The memory cache 220 may be configured to cache instructions and/or data for use by the cores 200A-H. As shown in FIG. 2, the memory cache 220 may be organized into multiple separately addressable banks that may each be independently accessed, such that in the absence of conflicts, each bank may concurrently return data to the core 200A-H requesting the data. In some embodiments, each individual bank may be implemented using set-associative or direct-mapped techniques. The memory cache 220 may be implemented in some embodiments as a writeback cache in which written (dirty) data may not be written to the main memory 115 until a corresponding cache line is evicted.

The memory interface 230 may be configured to manage the transfer of data between memory cache 220 and the main memory 115, for example in response to L3 fill requests and data evictions. In some embodiments, multiple instances of the memory interface 230 may be implemented, with each instance configured to control a respective bank of the main memory 115.

The timing or clock signals within the processor 113 may be provided with a clock control unit (CCU) 270. As shown in FIG. 2, the CCU 270 may be coupled to the cores 200A-H, the crossbar 210 and the L3 cache 220. Although this disclosure will focus on the CCU's 270 connection to the cores 200A-H and the crossbar 210, the CCU 270 may couple to other blocks within the processor 113. During operation, the CCU 270 may provide a plurality of timing or clock signals to the various blocks within the processor 113. Although the CCU 270 may be capable of providing multiple clock signals, the CCU 270 may provide a common clock signal to the cores 200A-H, the crossbar 210, and the memory cache 220 while providing separate non-core clock signals, or skipped clock signals, to the other blocks within the CCU 270.

The actual clock generation circuitry within the CCU 270 may take a variety of physical forms, including in some embodiments, a crystal based oscillator with relatively low phase noise and/or clock jitter. In other embodiments, the clock generation circuitry within the CCU 270 may be a frequency synthesized signal based on a crystal oscillator signal, such as a phase locked loop (PLL) synthesizer or a delay-locked-loop (DLL) synthesizer. Since the PLL and/or DLL are feedback and control loops that may synthesize a clock signal, there may be a predetermined period of time that elapses before for the PLL and/or DLL "lock" or provide a stable output clock signal to each of the blocks.

Regardless of the physical form of the circuitry that provides the clock signal, the clock signal may couple to one or more interface circuits, such as interface circuits 280A-H within the cores 200A-H. In some embodiments, the interface circuits 280A-H may be used to gate one or more of the clock signals from the CCU 270 and effectuate an overall reduction in the power consumption of the processor 113 during times of low activity by implementing a skipped clock signal. Furthermore, in some embodiments, the gating of the clock signals may be associated with the number of threads that remain active during the low power state, and thus the overall issue bandwidth of the core 200A-H may be maintained during low power states.

Figure 3A:
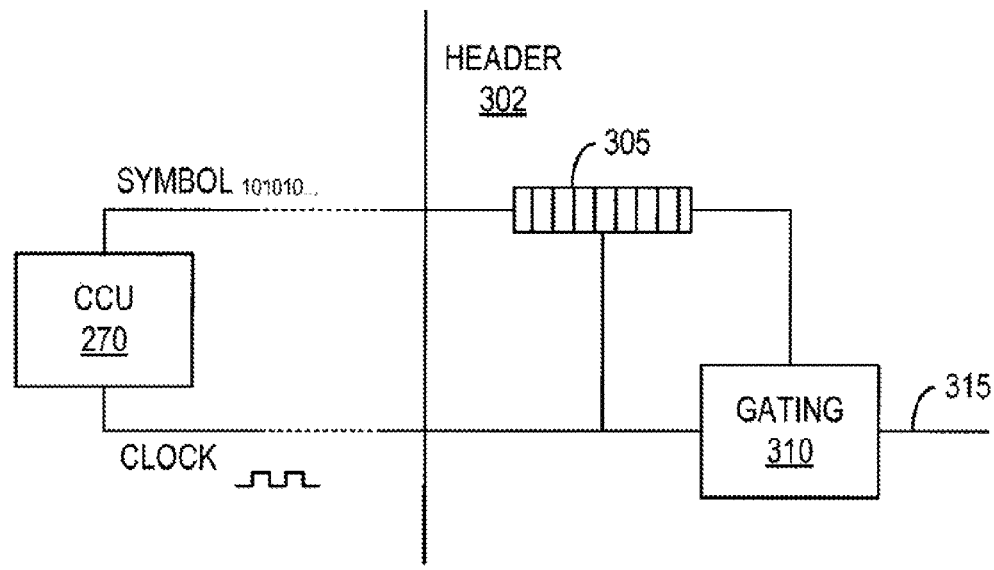
FIG. 3A is circuit diagram illustrating an example of a header circuit for a core of a processor.

FIG. 3A illustrates a more detailed view of the interface between the CCU 270 and the header circuit 302. Note that the header circuit 302 may represent any one of the header circuits 280A-H, 285, and/or 290. As shown, the header circuit 302 may include a shift register 305 coupled to a gating structure 310. During operation, the CCU 270 may deliver the clock signal to the gating structure 310 and also may deliver a symbol to the shift register 305. The symbol delivered may comprise a plurality of bits that are used by the gating structure 310 to produce a predetermined number and/or pattern on the resulting signal line 315 of pulses for distribution within the blocks (such as the cores 200A-H, the crossbar 210, and the L2 cache 220).

Over time these constituent bits may be shifted out of the shift register 305 where they may be used by the gating structure 310. For example, in some embodiments, the shift register 305 may be coupled to the clock signal and the constituent bits may be shifted out of the shift register 305 with each transition of the clock signal.

As the constituent bits of the clock signal are shifted out of the shift register 305, the gating structure 310 may logically combine the symbol with the clock signal to produce the ultimate timing signal for use within the blocks on the signal line 315. By altering the constituent bits and/or pattern of the symbol, the timing signal provided to the blocks on signal line 315 also may be altered. Since the power consumed by the blocks within the processor 113 (such as the cores 200A-H, the crossbar 210, and the L2 cache 220) is generally a function of the number of clock transitions that occur within a predetermined period of time, the power consumption of the various blocks within the processor 113 may be controlled by altering the symbol provided. Notably, this may occur without adjusting the frequency provided by the PLL or other clock generating circuitry, which may require re-locking the PLL.

In some embodiments, the header circuit 302 in the each of the blocks within the processor 113 (e.g., the header circuits 280A-H, 285, and 290) may receive separate symbols. Thus, in some embodiments, the processor 113 may separately control their power state. For example, the core 200A may receive a different symbol than the core 200B or the gating within the header circuit 280A may be different than the gating within the header circuit 280B. As a result, in some embodiments, the power consumed by each of the cores 200A-H may be adjusted independently.

Further, in some embodiments, the header circuit 302 in each of the blocks within the processor 113 (e.g., the header circuits 280A-H, 285, and 290) may be altered during operation of the processor. For example, the core 200A may receive a first symbol during a first time period. Later, perhaps in response to the request by a program for additional processing power by the core 200A, a second symbol may be provided to the header circuit 280A to increase the effective operating frequency of the clock signal for that core. At an even later time, the processor 113 may identify that the processing requirement for that core 200A is reduced, at which time a third mask may be provided to the header circuit 280A to reduce the effective operating frequency of the clock signal for that core and reduce the power consumption of the processor. In this manner, the effective operating frequencies of any core may be increased or decreased during operation of the processor 113 to balance the processing needs and power management needs of the processor.

Generally, one or more software programs operating on the processor may request changes to the skipped cycle clock signal of a core or cores. For example, a program operating on the processor may anticipate a need for increased processing speed of a core to process a portion of the program. In response, the request for an increase in the effective operating frequency of the core may be sent to the processor. In another example, a software program may operate on the processor that manages several aspects of the processor. This software program may monitor the operation of one or more cores of the processor and adjust the skipped cycle clock signals for the one or more cores accordingly to balance the processing need of the cores and the power consumed by the processor. However, as explained in more detail below, the implementation of the changes to the skipped cycle masks may be implemented by hardware devices, a software program or a combination of hardware and software in response to a request to change the operative frequency of one or more cores of the processor.

Figure 3B:
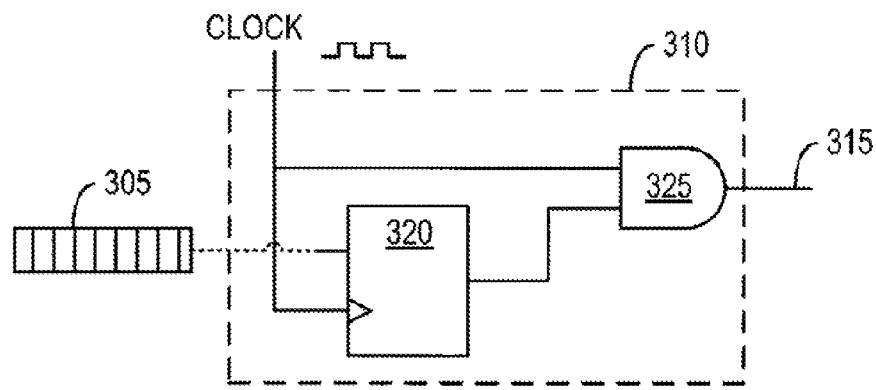
FIG. 3B is circuit diagram illustrating a gating circuit associated with a header circuit of a processor.

FIG. 3B illustrates but one exemplary clock gating structure 310 according to some embodiments. Other gating structures also are possible. As shown in FIG. 3B, the shift register 305 may be coupled to a latch 320. The clock signal also may couple to the latch 320 and a logic gate 325. During operation, the latch 320 may be transparent when the clock signal is low and holds the previous input after the clock goes high. Accordingly, the signal on the signal line 315 may be a gated representation of the clock signal.

Figure 4:
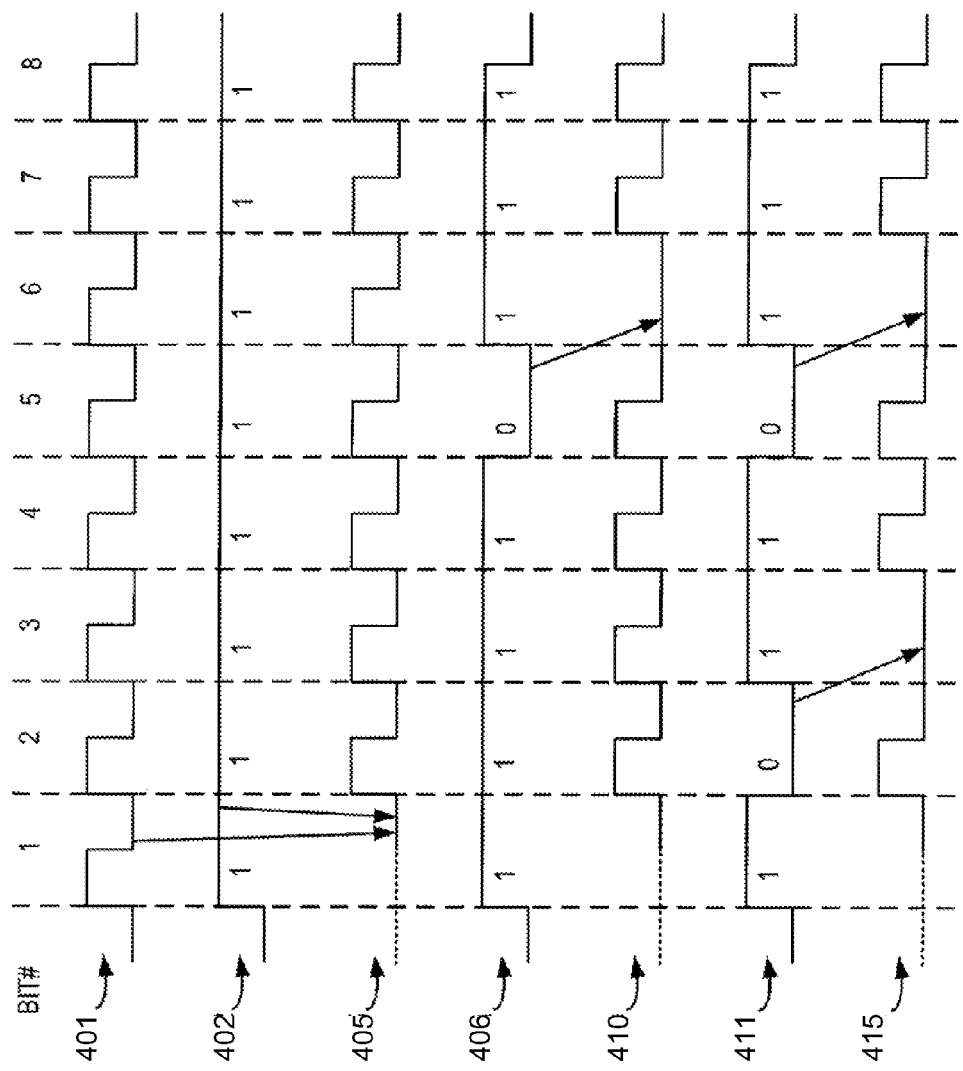
FIG. 4 is a timing diagram illustrating the use of a plurality of masks to create one or more skipped cycle clock signal.

FIG. 4 illustrates a plurality of possible waveforms 405, 410, and 415 that may result from the gating procedure described above. It should be noted that other waveforms are possible. Referring to FIG. 4, the clock signal coming into CCU 270 is shown as the waveform 401. In the example shown, the waveform 401 includes eight cycles, although other embodiments may include any number of cycles in the clock signal, and therefore, the signal 401 may take any variety of forms.

The waveform 402 may represent a possible symbol signal coming into the header circuit 302 and/or shift register 305. During operation, the gating structure 310 may logically combine the symbol 402 with the clock signal 401 as it is shifted out of the shift register 305. In some embodiments, this gating may be logically AND-ing the clock 401 with the symbol 402 on a cycle-by-cycle basis as the symbol is shifted out of the shift register. Although the waveform 402 is shown as having cycles that may correspond to the clock 401 (i.e., shown herein with eight cycles), it too may include any number of cycles, where the cycles may or may not correspond to the cycles of the clock 401.

The logical combination of the clock 401 and the symbol 402 may produce a resulting signal 405, which then may be delivered to the particular block that the header circuit 302 may be associated with. For example, if the header circuit 302 is the header circuit 280A within the core 200A-H, then the resulting signal 405 may be distributed to the core 200A-H to adjust its overall power consumption. Note that the symbol 402 is a "full power" signal, where all the constituent bits are "1 s", and therefore, the resulting signal 405 is substantially the same as the clock signal 401. This "full power" signal may also be referred to as having a 8/8 ratio of cycles with the clock cycles to cycles of the clock signal. In other words, none of the clock cycles of the clock signal 401 are skipped by this particular mask. This may cause the core 200A to consume the maximum amount of power. Other symbols and other ratios, however, may result in lower power consumption settings.

For example, FIG. 4 illustrates another symbol 406 that may be logically combined with the clock signal 401 to produce the resulting signal 410. Note that the fifth constituent bit of the symbol 406 includes a "0" or low value such that the resulting clock signal 410 may have a missing pulse every eight cycles. This may cause the block to skip execution every fifth cycle and consume substantially less power than it otherwise would have. This signal may also be referred to as having a 7/8 skipped clock signal ratio, as seven of the clock cycles are included in the skipped clock signal 406. In operation, a core operating on this skipped clock signal would not operate during the skipped cycle of the clock signal. In other words, by skipping one cycle of the clock signal, the core or cores operating on this signal, e.g., the core 200A, would not operate during the skipped cycle. This lowers the effective clock frequency for that core such that the power consumption of the processor is decreased.

Furthermore, since other blocks within the processor 113 may receive the same symbol 406 (such as the cache 220 and/or the crossbar 210), each of these blocks also may be coordinated to facilitate communication between the core or cores operating on a skipped cycle clock signal and those portions of the processor that are not utilizing a skipped cycle clock signal. This may be true for each block within the processor 113 that receives the same signal from the CCU 270.

FIG. 4 illustrates yet another exemplary signal 411 that may be logically combined with the clock signal 401 to produce the resulting signal 415. Here, the second and fifth constituent bits are "0" or de-asserted, resulting in a 6/8 ratioed skipped cycle ratio signal 415. This may correspond, for example, to the situation a core, e.g., 200B, does not operate for the second and fifth cycle of the clock signal 401. Thus, the effective operating frequency of the core 200B is less than the core clock signal 401 such that core 200B consumes less power than if running on the full clock signal.

Thus, in some embodiments, all threads may remain active during operation of the processor, but the clock signal may be gated within each block to control the power consumed therein. For example, if the overall workload for each thread is low, then the overall execution rate of one or more blocks may be controlled by locally gating the clock signal as described above such that the core operates on a skipped clock signal. This situation may occur when the temperature of the processor exceeds a predetermined amount, and as a result, one or more blocks may have their clocks gated to control the amount of power consumed. Notably this may occur without adjusting the PLL, which may require re-locking the PLL.

As mentioned above, changes to the operating frequency of a core of a processor may introduce disruptive voltage noise into the processing system that may degrade the performance of the processor. In particular, drastic changes to the operating frequency of a core, such as transitioning from a 7/8 ratioed cycle skipped clock signal to a 1/8 ratioed skipped clock signal, may introduce large amounts of voltage noise into the processor that may disrupt the operation of the processor. Smaller changes to operating frequencies typically provide less voltage noise. In general, the more spread out the changes to the skipped cycles occur in both time and logic space, the less voltage noise is created, thereby decreasing the odds of a disruptive noisy signal in the processor. In other words, by managing the changes made to the skipped clock cycles that occur in a system, the potential for a disruptive voltage noise signal is reduced.

Figure 5A:
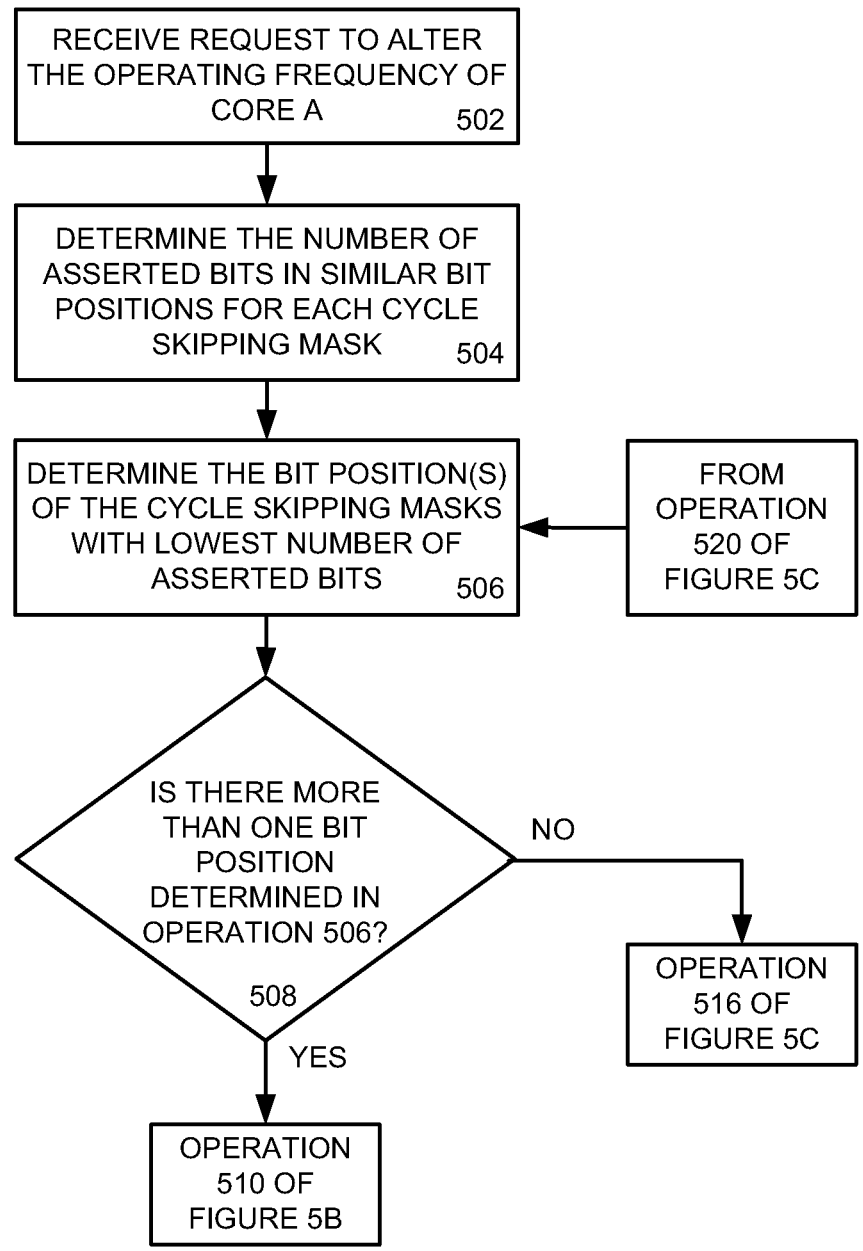
FIGS. 5A-5C are flowcharts of a method for generating one or more skipped cycle clock masks to minimize the noise within a processor operating on one or more skipped cycle clock signals.
Figure 5B:
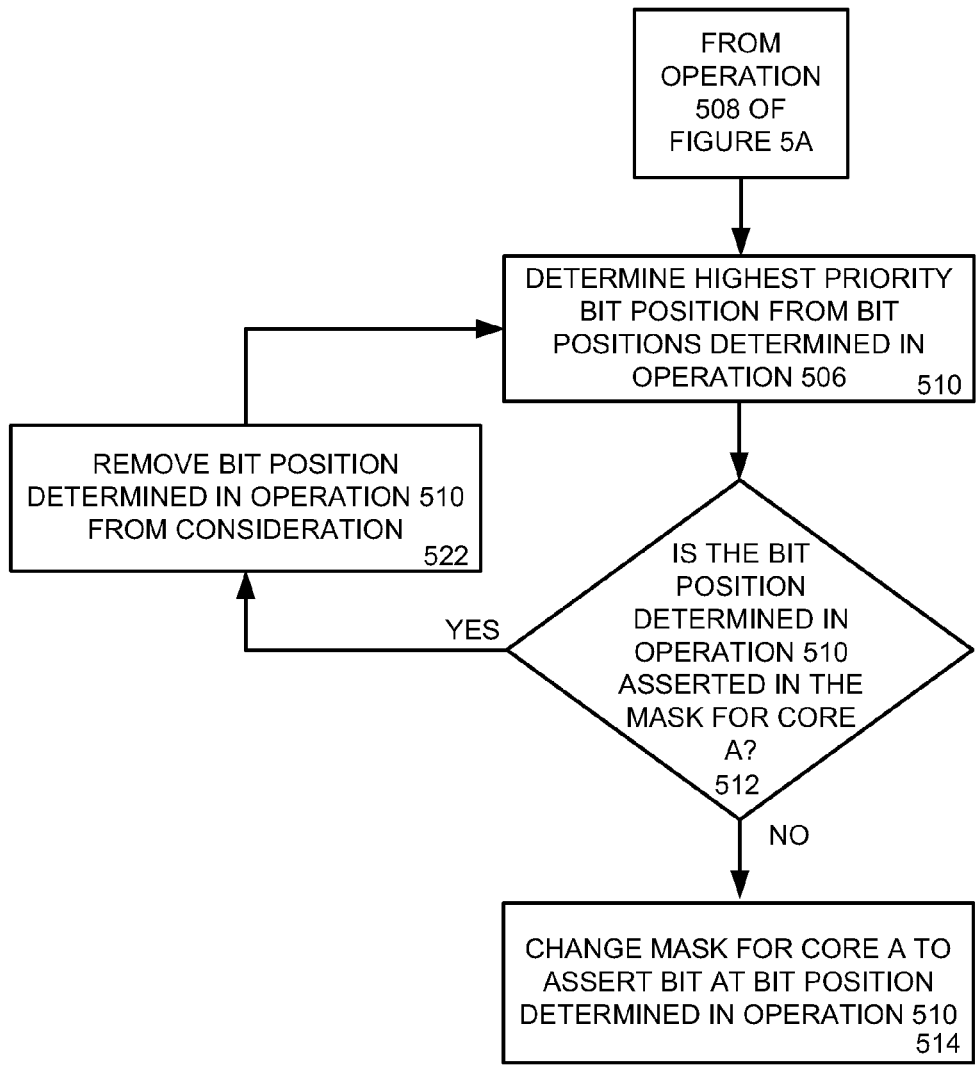
Figure 5C:
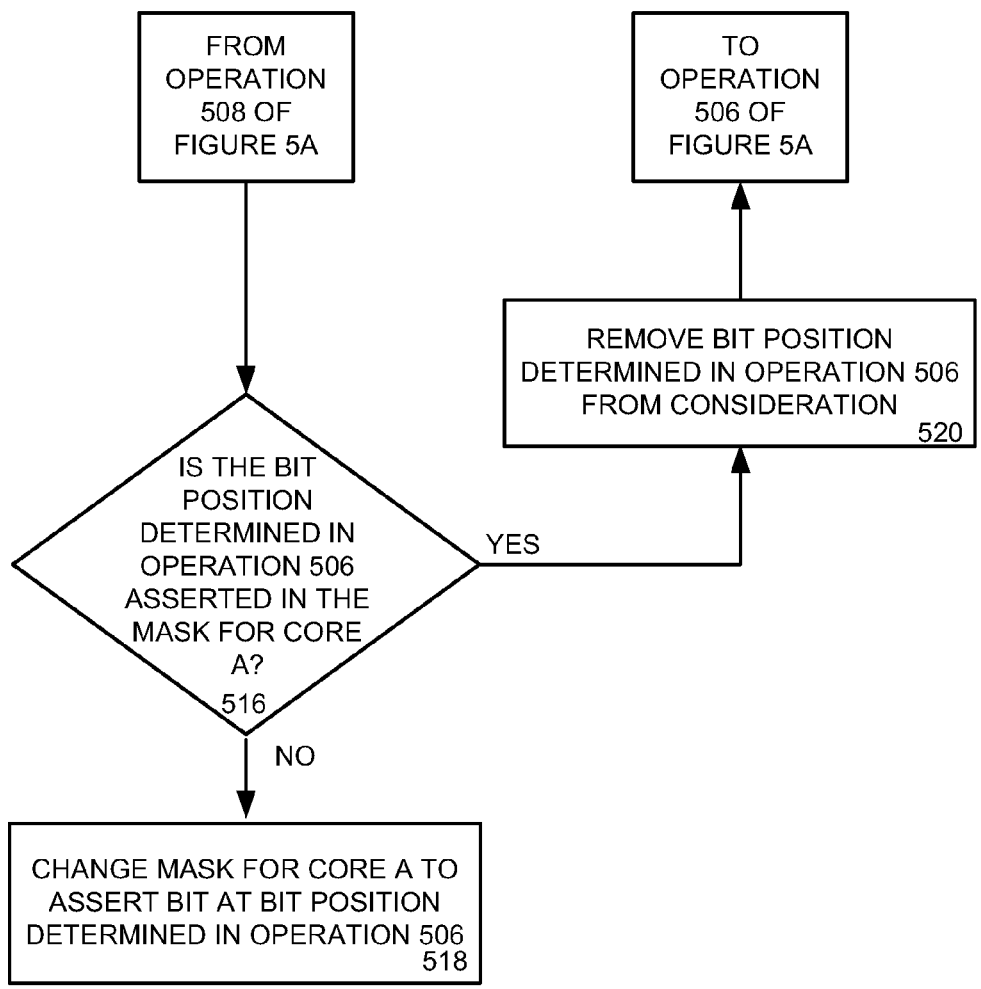

FIGS. 5A-5C are flowcharts of a method for generating one or more skipped cycle clock masks to minimize voltage noise within a processor during transition of one or more skipped cycle clock signals. In one embodiment, the operations of the method are performed by one or more logic devices associated with the processor. In another embodiment, the operations are performed by a software program. In yet another embodiment, the operations are performed by a combination of hardware and software.

Regardless of the implementation used, the method typically begins from a request by a program operating on the processor to increase or decrease the effective operating frequency of one or more cores of the processor. For simplicity, the operations of the method of FIGS. 5A-5C are performed when a request for an increase to the effective operating frequency of one or more cores is received from the program. However, a similar method may also be performed for decreasing the effective operating frequency of a core.

Beginning in operation 502, the processor receives a request from an executing program or processor managing program to adjust the effective operating frequency of a core of the processor, labeled here as "core A". In the embodiment of FIGS. 5A-5C, the request is to increase the operating frequency of core A. As explained above, the operating frequency of a core may be adjusted by skipping one or more cycles of a core clock signal. Thus, the request received in operation 502 may be in response to a processing request from the processor to increase the processing power of the core during a high execution period of the processor.

As also explained above, a skipped cycle clock signal may be generated through the application of a mask to the core clock signal. In general, the de-asserted bits of the mask create a skipped cycle of the clock signal. Thus, to increase the operating frequency of a core, the processor asserts one or more de-asserted bits of the mask associated with that core such that one or more clock cycles are no longer skipped, thereby increasing the effective frequency of the skipped clock signal. The method outlined in FIGS. 5A-5C provide an algorithm to determine which bits of the core masks are asserted in response to the request that manages the potential voltage noise introduced to the processor as a result of the change to the timing signals.

To begin determining which bit of the mask for core A is asserted to increase the operating frequency of core A, the processor determines the number of asserted bits in the similar bit positions for the masks for each core in operation 504. For example, the clock skipping masks for a particular implementation may consist of eight bits 0-7, such as shown above with respect to FIG. 4. Although this example utilize clock skipping masks of eight bits, it should be appreciated that the masks may include any number of bits. In operation 504, the processor determines the number of asserted bits for each mask generated by the processor for each bit position. Thus, the processor determines how many bits in the 0 bit position for the masks for all of the cores are asserted. One particular example of a processor that utilizes masks for cycle skipping is shown in Table 1 below.

TABLE 1

| Core Mask | Cycle Ratio | Mask Bits | | | | | | | |
|---|---|---|---|---|---|---|---|---|---|
| | | 0 | 1 | 2 | 3 | 4 | 5 | 6 | 7 |
| Core 0 | 2/8 | 1 | 1 | 0 | 0 | 0 | 0 | 0 | 0 |
| Core 1 | 2/8 | 0 | 0 | 0 | 1 | 1 | 0 | 0 | 0 |
| Core 2 | 2/8 | 1 | 0 | 1 | 0 | 0 | 0 | 0 | 0 |
| Core 3 | 3/8 | 0 | 0 | 0 | 0 | 0 | 1 | 1 | 1 |
| | | 2 | 1 | 1 | 1 | 1 | 1 | 1 | 1 | Sum |
| | | 0 | 4 | 2 | 6 | 1 | 5 | 3 | 7 | Priority |

As shown in Table 1, the processor of this example includes four cores (cores 0-3) that use a cycle skipping mask to operate on a skipped cycle clock signal. In particular, cores 0-2 operate on a 2/8 skipped clock signal, while core 3 operates on a 3/8 skipped clock signal. As such, the mask symbol for core 0 comprises an eight bit string 11000000 aligned in bit positions 0-7. As explained above, the asserted bits in bit position 0 and bit position 1 result in the clock signal for core 0 including two clock cycles followed by six skipped clock cycles such that core 0 operates on a skipped clock signal with a 2/8 effective clock frequency. In a similar manner, the mask symbol for core 1 comprises an eight bit string 00011000 aligned in bit positions 0-7 and the mask symbol for core 2 comprises an eight bit string 1010000 aligned in bit positions 0-7, such that core 1 and core 2 also operate on a 2/8 ratioed skipped clock signal. The mask symbol for core 3 comprises an eight bit string 00000111 aligned in bit positions 0-7, resulting in the 3/8 ratioed skipped clock signal. Although the example shown in Table 1 includes four cores, it should be appreciated that any number of cores may be included in the processor.

Returning to operation 504 of FIG. 5A, the processor thus determines the number of asserted bits for all core masks at the respective bit positions. The result of this operation is illustrated in Table 1 by the "sum" line. In particular, two masks include an asserted bit in bit position 0, namely the mask for core 0 and the mask for core 2. All other bit positions in this example include one asserted bit for that bit position. In particular, only the mask for core 0 has an asserted bit at bit position 1, only the mask for core 2 has an asserted bit at bit position 2, only the mask for core 1 has an asserted bit at bit positions 3 and 4, and so on. Through operation 504 of the method of FIG. 5A, this sum of asserted bits for each bit position of the masks is determined.

In operation 506, the processor utilizes the sums determined in operation 504 to determine which bit position has the lowest number of asserted bits. Utilizing the example of Table 1, bit positions 1-7 have a single asserted bit in those bit positions while bit position 0 has two asserted bits. Thus, the processor determines in operation 506 that bit positions 1-7 have the lowest number of asserted bits.

In another example, the mask for core 3 of the processor shown in Table 1 may operate on a 2/8 clock signal such that the bit in bit position 7 for that mask is not asserted. In this example, there would be no asserted bit in bit position 7 for any of the masks of the processor, such that the sum value for bit position 7 would be zero. In this example, the processor determines that bit position 7 would have the lowest number of asserted bits in operation 506.

As in the example of Table 1, more than one bit position has the lowest number of asserted bits. Thus, in operation 508, the processor accounts for this by determining if there is more than one bit position with the lowest number of asserted bits. If there is more than one bit position with the lowest number of asserted bits, the processor executes operation 510 of FIG. 5B. However, if there is only one bit position with the lowest number of asserted bits, such as in the example above where there is no asserted bit in bit position 7, the processor executes operation 516 of FIG. 5C.

Turning to FIG. 5B, if the processor determines that more than one bit position has the lowest number of asserted bits, then the processor determines the bit position of the ones identified in operation 506 with the highest priority in operation 510. In general, the priority of the bit positions are a pre-determined ranking of the bit positions to temporally space out the skipped clock cycles between the core masks. The priority rankings of the bit positions may take any form, however, to rank the bit positions as desired to separate the changes to the mask symbols. One example of a priority ranking of the bit positions is illustrated in Table 1. In particular, bit position 0 has the highest priority (priority 0 in the table represents the highest priority), bit position 4 has the second highest priority (priority value 1), bit position 2 has the third highest priority (priority value 2) and so on to bit position 7 which has the lowest priority.

The priority ranking of the bit positions provide a spread out approach to changing the bits of the masks. In particular, the priority rankings attempt to separate the change bits of the masks such that two clock consecutive cycles are not presented by the changes to the masks. In other words, the priority ranks the bit positions so there is space between the prioritized bit positions. In the particular example shown in Table 1, the prioritize rankings separate any changed bits by some clock cycles. Thus, if bit position 0 represents the highest priority, the next highest priority is bit position 4, or three clock cycles away. The next highest priority is bit position 1, which is at least two bit positions away from bit position 4. In this manner, the priority rankings attempt to separate the changes to the bit masks into bit positions that are not consecutive such that the newly presented or allowed cycles are temporally spaced apart. Such a configuration may reduce the voltage noise introduced into the system through any additionally skipped clock cycles.

Regardless of the priority rankings given to the bit positions of the cycle skipping masks, the processor determines the bit position of the ones identified in operation 506 with the highest priority in operation 510. In the example shown in Table 1, the lower the priority number, the higher priority ranking. Thus, priority number zero associated with bit position zero is the highest priority ranking. In operation 510, the processor analyzes the bit positions identified in operation 506 and determines, from that list of bit positions, which bit position has the highest priority.

Once the processor has identified which bit position of the plurality of bit positions identified in operation 506 has the highest priority associated with the bit position, the processor then determines in operation 512 if the mask for core A has an asserted bit in the identified bit position. As mentioned above, an asserted bit within a mask for a core indicates an allowed or asserted clock cycle associated with that bit position. Thus, if a mask includes an asserted bit in a particular bit position, the clock cycle associated with that bit position is not skipped but is propagated through to the core such that the core operates on the clock cycle. To increase the effective operating frequency of the clock signal of the core, the mask for that core may assert a bit that is de-asserted. Therefore, in operation 512, the processor may determine if the mask for core A has an asserted bit at the bit position identified in operation 510. If the identified bit position is not asserted, the processor may continue on to operation 514 and generate a new mask for that core that includes an asserted bit in the bit position identified in operation 510. In general, through the operations described above, the voltage noise created by adjusting the operating frequency of a core or cores is minimized.

Additionally, in one embodiment the execution of operation 514 may be delayed by the processor to further temporally spread out the changes to the core masks. For example, subsequent to the execution of operations 510 and 512 to determine which bit of the mask is altered, the processor may delay the change to the identified mask for a predetermined or calculated amount of time. Once the delay period has elapsed, the processor may then execute operation 514 to change the mask as indicated above. In one example, the delay is programmable by the processor or a user of the processor. In another example, the delay is created by utilizing one or more hardware devices so that the delay period is constant. In yet another example, the delay may be automatically adjusted by the processor in response to one or more performance measurements obtained by the processor. Thus, in this example, if the processor detects a voltage noise level above a threshold value, the processor may adjust the delay imposed on the mask changes accordingly to reduce the voltage noise detected. In general, the delay of the change to the core masks may be implemented in hardware, software or a combination of hardware and software.

If it is determined in operation 512 that the bit in the bit position identified in operation 510 is already asserted, the processor may remove that bit position from consideration in operation 522. With that bit position removed from consideration, the processor may return to operation 510 and determine the bit position with the highest priority of the remaining bit positions. In this manner, operations 510 and 512 are repeated until a bit position is determined where the bit in that bit position is un-asserted. Thus, through these operations, the skipped clock masks are generated by the processor to provide the one or more skipped cycle clock signals to the cores of the processor in a manner that reduces any voltage noise created from the altering skipped cycle clock signals.

If the processor determines in operation 508 that there is only one bit position determined from operation 506, the processor continues to operation 516 of FIG. 5C. Similar to operation 512, the processor 516 in operation 516 the processor may determine if the mask for core A has an asserted bit at the bit position identified in operation 506. If the identified bit position is not asserted, the processor may continue on to operation 518 and generate a new mask for that core that includes an asserted bit in the bit position identified in operation 506. Further, a delay may be imposed prior to the execution of operation 518 to temporally spread out the change to the mask, as described above. Alternatively, if the identified bit position is asserted, the processor may remove that bit position from consideration in operation 520. Upon removing the bit position from consideration, the processor returns to operation 506 of FIG. 5A and again determines the bit position or positions with the lowest number of asserted bits, with the bit position with the lowest number removed from consideration in operation 506. The process of generating a mask for a core that minimizes the voltage noise thus continues as described above.

The operations of the method described in relation to FIGS. 5A-5C are further illustrated through the examples provided below in relation to Tables 1 through 3. In particular, Table 1 provides one example of a processor that incorporates skipped cycle clock signals to operate one or more cores. Specifically, the processor depicted in Table 1 includes four cores (Core 0 through Core 3) operating on a skipped cycle clock signal. Core 0, Core 1 and Core 2 operate on a 2/8 ratioed skipped cycle clock signal and Core 3 operates on a 3/8 ratioed skipped cycle clock signal. Exemplary skipped cycle mask symbols that are applied to a system clock signal are also illustrated in Table 1. It should be appreciated that the particulars of the processor illustrated in Table 1 are provided as an example. Other processors may include more or less processors, different skipped cycle clock signals and different mask symbols to realize the skipped clock signals.

During operation of the processor, a program may request that the skipped cycle clock signals for one or more of the cores be altered in response to an increase in processing need or to conserve the power consumed by the processor. In one example, the program may request the skipped cycle clock signal for Core 0 be increased to a 3/8 clock signal, or be altered to allow three clock cycles into the core to operate the core. In response to this request, the processor may perform the operations outlined in the flowchart of FIGS. 5A-5C to change the mask symbol for Core 0.

Initially, the processor determines the number of asserted bits for each bit positions of all of the mask symbols. The number of asserted bits for each bit positions is determined by summing the number of asserted bits for each mask in each of the associated bit positions. As shown in the "Sum" line of Table 1, bit position 0 has two asserted bits and bit positions 1-7 each have one asserted bit. Further, the processor uses this information to determine which bit position or bit positions have the lowest number of asserted bit positions. Because more than one bit position has the lowest number of asserted bit positions, the processor continues to the flowchart of FIG. 5B.

Utilizing the flowchart of FIG. 5B, the processor determines the bit position with the highest priority of those identified above. In this example, the processor determines the bit position of bit positions 0-7 that has the highest priority. Based on the priority ranking shown in the line "Priority" in Table 1, bit position has the highest priority of bit positions 1-7. In particular, bit position 4 has a priority ranking of "1", which is the highest ranking of bit positions 1-7. Although bit position 0 has a higher priority ranking, this position was not identified as having the lowest number of asserted bits above, so this bit position is removed from consideration in this example.

Continuing through the flowchart of FIG. 5B, the processor than determines if the bit position selected for assertion (bit position 4 of the mask for Core 0) is already asserted. As shown in Table 1, bit position 4 for Core 0 is not asserted. Thus, the processor may generate a new skipping mask symbol for Core 0 that asserts the bit in bit position 4, providing the core with a 3/8 ratioed skipped cycle clock signal in response to the request provided by the program. The resulting masks are shown in Table 2 below.

TABLE 2

| Core Mask | Cycle Ratio | Mask Bits | | | | | | | |
|---|---|---|---|---|---|---|---|---|---|
| | | 0 | 1 | 2 | 3 | 4 | 5 | 6 | 7 |
| Core 0 | 3/8 | 1 | 1 | 0 | 0 | 1 | 0 | 0 | 0 |
| Core 1 | 2/8 | 0 | 0 | 0 | 1 | 1 | 0 | 0 | 0 |
| Core 2 | 2/8 | 1 | 0 | 1 | 0 | 0 | 0 | 0 | 0 |
| Core 3 | 3/8 | 0 | 0 | 0 | 0 | 0 | 1 | 1 | 1 |
| | | 2 | 1 | 1 | 1 | 2 | 1 | 1 | 1 Sum |
| | | 0 | 4 | 2 | 6 | 1 | 5 | 3 | 7 Priority |

Continuing the example shown in Tables 1-3, the processor may now request the skipped cycle clock signal for Core 3 be increased to a 3/8 clock signal. In response, the processor determines the number of asserted bits for each bit positions of all of the mask symbols. As shown in the "Sum" line of Table 2, bit position 0 and bit position 4 now have two asserted bits and bit positions 1-3 and 5-7 each have one asserted bit. Thus, the processor determines that bit positions 1-3 and 5-7 have the lowest number of asserted bit positions. Because more than one bit position has the lowest number of asserted bit positions, the processor continues to the flowchart of FIG. 5B.

Further, the processor determines, using the priority rankings, that bit position 2 has a priority ranking of "2", which is the highest ranking of bit positions 1-3 and 5-7. Again, although bit positions 0 and 1 have a higher priority ranking, these positions are not identified as having the lowest number of asserted bits above, so these bit positions are removed from consideration in this example.

Continuing through the flowchart of FIG. 5B, the processor than determines the mask for Core 2 has an asserted bit in the identified bit position, namely bit position 2. In this example as shown in Table 2, the bit in bit position 2 for the mask of Core 2 is already asserted. In response, the processor then determines the bit position of the bit positions selected (bit positions 1-3 and 5-7) with the next highest priority. Thus, bit position, with a priority ranking of "3" is the next highest priority of those bit positions. Also, because the bit in bit position 6 of the mask symbol for core 2 is not asserted, the processor may generate a new skipping mask symbol for Core 2 that asserts the bit in bit position 6, providing the core with a 3/8 ratioed skipped cycle clock signal in response to the request provided by the program. The resulting masks are shown in Table 3 below.

TABLE 3

| Core Mask | Cycle Ratio | Mask Bits | | | | | | | |
|---|---|---|---|---|---|---|---|---|---|
| | | 0 | 1 | 2 | 3 | 4 | 5 | 6 | 7 |
| Core 0 | 3/8 | 1 | 1 | 0 | 0 | 1 | 0 | 0 | 0 |
| Core 1 | 2/8 | 0 | 0 | 0 | 1 | 1 | 0 | 0 | 0 |
| Core 2 | 3/8 | 1 | 0 | 1 | 0 | 0 | 0 | 1 | 0 |
| Core 3 | 3/8 | 0 | 0 | 0 | 0 | 0 | 1 | 1 | 1 |
| | | 2 | 1 | 1 | 1 | 2 | 1 | 2 | 1 Sum |
| | | 0 | 4 | 2 | 6 | 1 | 5 | 3 | 7 Priority |

As should be appreciated, the method disclosed in relation to FIGS. 5A-5C spread out the allowed clock cycles such that each of the masks do not propagate or allow one particular cycle of the clock signal in response to a request from the system with disregard to the other clock cycles. In other words, the method attempts to spread out the passed cycles through the bits of the masks such that the same cycle is not suddenly passed by each core the majority of the time. This may reduce the voltage noise introduced into the system during adjustment to the core masks. Further, the method also prioritizes which cycle is passed to the core to reduce the number of consecutive passed cycles within a single core mask. In general, the method of FIGS. 5A-5C implements alterations to the core mask symbols such that generated voltage noise caused by the alterations is minimized, if possible.

It should be noted that the flowcharts of FIGS. 5A-5C are illustrative only. Alternative embodiments of the present invention may add operations, omit operations, or change the order of operations without affecting the spirit and scope of the present invention.

The foregoing merely illustrates the principles of the invention. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the invention and are thus within the spirit and scope of the present invention. From the above description and drawings, it will be understood by those of ordinary skill in the art that the particular embodiments shown and described are for purposes of illustrations only and are not intended to limit the scope of the present invention. References to details of particular embodiments are not intended to limit the scope of the invention.

What is claimed is:

1. A method of power savings on a processor, the method comprising:
providing a first skipped cycle timing signal to the processor, wherein the first skipped cycle timing signal includes a gated representation of a global timing signal and a first symbol, wherein the first symbol comprises a plurality of non-asserted bits in a plurality of bit positions and an asserted bit in at least one other bit position, wherein the plurality of non-asserted bits correspond to a skipped cycle of the global timing signal;

receiving a request to adjust the first skipped cycle timing signal in response to a plurality of factors related to processor conditions;

selecting a bit position from the plurality of bit positions of non-asserted bits;

generating a second symbol in response to the request; and providing a second skipped cycle timing signal to the processor, wherein the second skipped cycle timing signal includes a gated representation of the global timing signal and the second symbol such that the non-asserted bits of the second symbol correspond to a plurality of skipped cycles of the global timing signal;

wherein the selection of the bit position from the plurality of bit positions of non-asserted bits is based at least on a voltage noise generated from providing the second skipped cycle timing signal to the processor.

2. The method of claim 1 wherein the processor comprises a plurality of cores, wherein each core within the plurality of cores comprises one or more header circuits.

3. The method of claim 2 wherein a symbol is associated with each of the plurality of cores, each symbol comprising a plurality of non-asserted bits in a plurality of bit positions that correspond to a skipped cycle of the global timing signal and an asserted bit in at least one other bit position.

4. The method of claim 3 further comprising:
summing the number of asserted bits in each bit position of the plurality of bit positions of the plurality of symbols.

5. The method of claim 4 further comprising:
generating a priority ranking of the plurality of bit positions of the plurality of symbols.

6. The method of claim 5 further comprising:
determining a subset of the plurality of bit positions of the plurality of symbols, wherein the subset of the plurality of bit positions of the plurality of symbols have the lowest number of summed asserted bits.

7. The method of claim 6 wherein selecting the bit position comprises:
selecting a first bit position from the subset of the plurality of bit positions of the plurality of symbols, the bit position corresponding to the bit position of the subset with a highest priority ranking.

8. The method of claim 7 wherein the generating the second symbol comprises:
asserting a bit at the selected bit position from the subset of the plurality of bit positions of the plurality of symbols if the bit at the selected bit position is non-asserted.

9. The method of claim 7 further comprising:
selecting a second bit position from the subset of the plurality of bit positions of the plurality of symbols corresponding to the bit position of the subset with the second highest priority ranking if the bit at the bit position of the subset with the highest priority ranking is asserted.

10. The method of claim 5 wherein the generation of the priority ranking of the plurality bit positions of the plurality of symbols are configured such that consecutive rankings are separated by at least one bit position.

11. A multi-threaded processor, comprising:
a plurality of cores, wherein each core within the plurality of cores comprises one or more header circuits; and
a clock control unit (CCU) coupled to the one or more header circuits; and wherein each of the one or more header circuits provides a first domain skipped timing signal comprising a gated representation of a global clock signal and a first skipped timing symbol, each first skipped timing symbol comprising a plurality of non-asserted bits in a plurality of bit positions and an asserted bit in at least one other bit position, wherein the plurality of non-asserted bits correspond to a skipped cycle of the global timing signal;

wherein the processor is further configured to:
receive a request to adjust the domain skipped cycle timing signal for at least one of the plurality of cores; and
assert a non-asserted bit of the first skipped timing symbol of the at least one of the plurality of cores to generate a second skipped timing symbol, the assertion based at least on a voltage noise generated from providing a second skipped cycle timing signal comprising a gated representation of a global clock signal and the second skipped timing symbol.

12. The processor of claim 11 wherein the processor is further configured to:
sum the number of asserted bits in each bit position of the plurality of bit positions of the first skipped timing symbols for the header circuits.

13. The processor of claim 12 wherein the processor is further configured to:
rank the plurality of bit positions of the plurality of the first skipped timing symbols for the header circuits.

14. The processor of claim 13 wherein the processor is further configured to:
determine a subset of the plurality of bit positions of the first skipped timing symbol for the at least one of the plurality of cores, wherein the subset of the plurality of bit positions of the plurality of first skipped timing symbols have the lowest number of summed asserted bits.

15. The processor of claim 14 wherein the processor is further configured to:
select the non-asserted bit to assert from the subset of the plurality of bit positions of the first skipped timing symbol for the at least one of the plurality of cores, the bit position corresponding to the bit position of the subset with the highest priority ranking.

16. The processor of claim 14 wherein the processor is further configured to:
select a bit position from the subset of the plurality of bit positions of the first skipped timing symbol for the at least one of the plurality of cores corresponding to the bit position of the subset with the second highest priority ranking if the bit at the bit position of the subset with the highest priority ranking is asserted.

17. The processor of claim 11 wherein the request to adjust the domain skipped cycle timing signal for at least one of the plurality of cores is provided by a program executing on the at least one of the plurality of cores.

18. A computer system, comprising:
an input unit;
a processor coupled to the input unit, the processor comprising:
a plurality of cores, wherein each core within the plurality of cores comprises one or more header circuits;
a clock control unit (CCU) coupled to the one or more header circuits;
wherein each of the one or more header circuits provides a first domain skipped timing signal comprising a gated representation of a global clock signal and a first skipped timing symbol, each first skipped timing symbol comprising a plurality of non-asserted bits in a plurality of bit positions corresponding to a skipped cycle of the global timing signal and an asserted bit in at least one other bit position; and wherein the processor is further configured to:

receive a request to adjust the domain skipped cycle timing signal for at least one of the plurality of cores; and assert a non-asserted bit of the first skipped timing symbol of the at least one of the plurality of cores to generate a second skipped timing symbol, the assertion based at least on a voltage noise generated from providing a second skipped cycle timing signal comprising a gated representation of a global clock signal and the second skipped timing symbol.

19. The computer system of claim 18 further comprising: a plurality of summing logic devices configured to sum the number of asserted bits in each bit position of the plurality of bit positions of the first skipped timing symbols for the header circuits.

20. The computer system of claim 18 further comprising: a ranking module configured to generate a ranking the plurality of bit positions of the plurality of the first skipped timing symbols for the header circuits.

* * * * *

UNITED STATES PATENT AND TRADEMARK OFFICE
CERTIFICATE OF CORRECTION

| | | |
|---|---|---|
| PATENT NO. | : 8,949,651 B2 | Page 1 of 1 |
| APPLICATION NO. | : 13/631296 | |
| DATED | : February 3, 2015 | |
| INVENTOR(S) | : Turullols | |

It is certified that error appears in the above-identified patent and that said Letters Patent is hereby corrected as shown below:

Title page, item (54), delete "MASK" and insert -- MASKS --, therefor.

Specification

In column 1 (in title), line 2, delete "MASK" and insert -- MASKS --, therefor.

In column 3, line 58, delete "Inc," and insert -- Inc., --, therefor.

In column 10, line 13, delete "ratiod" and insert -- ratioed --, therefor.

Signed and Sealed this
Twenty-fourth Day of November, 2015

Michelle K. Lee
*Director of the United States Patent and Trademark Office*